United States Patent [19]

Matsushita

[11] Patent Number: 4,885,257
[45] Date of Patent: Dec. 5, 1989

[54] GETTERING PROCESS WITH MULTI-STEP ANNEALING AND INERT ION IMPLANTATION

[75] Inventor: Yoshiaki Matsushita, Kawasaki, Japan

[73] Assignee: Kabushiki Kaisha Toshiba, Japan

[21] Appl. No.: 57,672

[22] Filed: Jun. 2, 1987

Related U.S. Application Data

[63] Continuation of Ser. No. 630,689, Jul. 13, 1984, abandoned.

[30] Foreign Application Priority Data

Jul. 29, 1983 [JP] Japan .................................. 58-138857

[51] Int. Cl.⁴ .................... H01L 21/322; H01L 21/265
[52] U.S. Cl. ............................... 437/11; 148/DIG. 3; 148/DIG. 24; 148/DIG. 60; 148/DIG. 76; 148/DIG. 83; 148/DIG. 97; 148/DIG. 127; 148/33.2; 156/692; 357/91; 437/24; 437/25; 437/82; 437/85; 437/247; 437/939
[58] Field of Search ................... 148/DIG. 3, 4, 9, 10, 148/11, DIG. 24, DIG. 60, 61, DIG. 76, DIG. 83, DIG. 97, 128, DIG. 127, 33.2; 156/610–614; 437/10, 11, 24, 25, 31, 41, 59, 81, 85, 106, 145, 939, 946, 247; 357/91

[56] References Cited

U.S. PATENT DOCUMENTS

| | | | |
|---|---|---|---|
| 4,069,068 | 1/1978 | Beyer et al. | 437/11 |
| 4,082,571 | 6/1978 | Gravl et al. | |
| 4,151,011 | 6/1979 | Mihashi et al. | 357/91 |
| 4,157,268 | 6/1979 | Bergeron et al. | 437/11 |
| 4,197,144 | 4/1980 | Kirkpatrick et al. | 437/11 |
| 4,371,403 | 2/1983 | Ikubo et al. | 357/91 |
| 4,376,657 | 3/1983 | Nagasawa et al. | 437/11 |
| 4,608,096 | 8/1986 | Hill | 148/33 |
| 4,637,123 | 1/1987 | Cazcarra et al. | 437/939 |

FOREIGN PATENT DOCUMENTS

| | | | |
|---|---|---|---|
| 0158431 | 12/1981 | Japan | 437/939 |
| 0177530 | 11/1982 | Japan | 437/939 |
| 0201032 | 12/1982 | Japan | 437/939 |
| 0102528 | 6/1983 | Japan | 437/939 |
| 0025230 | 2/1984 | Japan | 437/939 |
| 0084432 | 5/1984 | Japan | 437/939 |

OTHER PUBLICATIONS

Craven et al., "Internal Gettering of Silicon" Solid State Technology, Jul. 1981, pp. 55–61.
Hu, "Precipitation of Oxygen in Silicon: Some Phenomena and a Nucleation Model," J. Appl. Phys., vol. 52, No. 6, Jun. 1981, pp. 3974–3984.

Primary Examiner—Brian E. Hearn
Assistant Examiner—William D. Bunch
Attorney, Agent, or Firm—Banner, Birch, McKie and Beckett

[57] ABSTRACT

A semiconductor substrate and process for making are disclosed. The substrate is suitable for use in manufacturing large scale integrated circuits. The process comprises the steps of heating a semiconductor substrate at a temperature not lower than 1100° C., implanting electrically inert impurities into the major surface of the substrate, heating the substrate at a temperature ranging from 600° to 900° C. and providing a single crystal semiconductor layer.

3 Claims, 4 Drawing Sheets

GETTERING PROCESS WITH MULTI-STEP ANNEALING AND INERT ION IMPLANTATION

This application is a continuation of application Ser. No. 630,689, filed July 13, 1984 now abandoned.

BACKGROUND OF THE INVENTION

This invention relates generally to the field of semiconductors and, more particularly, is directed to a semiconductor substrate and process for making such suitable for use in manufacturing a metal oxide semiconductor large scale integrated circuit.

There are two types of semiconductor substrates used in the manufacture of semiconductor devices such as metal oxide semiconductor large scale integrated circuits. One type is known as an intrinsic getter (referred to as IG hereafter) wafer which is a semiconductor wafer having micro defects and a non-defect region near its surface. The second type is a semiconductor wafer having a high resistivity semiconductor layer formed on a low resistivity semiconductor substrate by an epitaxial growth process. The IG wafer, or first type, prevents junction leakage because it inhibits the occurrence of oxidation induced stacking faults (hereafter referred to as "OSF"). The epitaxial wafer, or second type, can decrease the pause time of a semiconductor device because the diffusion length of electrons accidentally generated in the wafer can be decreased.

A semiconductor substrate as shown in FIG. 1 has been proposed which employs the characteristics of both the IG wafer and the epitaxial wafer explained above. The substrate 5 has a low resistivity p+-type IG wafer 2 with micro defects 1 in its interior and a high resistivity p-type semiconductor layer 3 grown on the wafer by an epitaxial growth process. In this type of semiconductor substrate, stacking faults and shallow pits in the semiconducor layer 3 are minimized. Thus, the quality of the crystal in layer 3 is improved due to the IG effect.

Since a large potential difference exists at the junction between the p+-type IG wafer 2 and the p-type semiconductor layer 3 as shown ink FIG. 2, electrons accidentally generated by x-rays in layer 3 will be repelled at the junction. Thus, the electrons are prevented from diffusing into IG wafer 21. As a result, the semiconductor substrate has a deficiency which is improved by the IG wafer alone without the epitaxial layer.

SUMMARY OF THE INVENTION

It is therefore a specific object of the present invention to provide a process for making a semiconductor substrate having excellent operating characteristics with respect to both the IG wafer and the epitaxial wafer.

It is another specific object of the present invention to provide a process for making an improved semiconductor substrate for use with a large scale integrated circuit.

It is a further specific object of the present invention to provide a process for making a semiconductor substrate having a structure which can effectively absorb electrons inadvertently generated in the substrate.

It is another specific object of the present invention to provide a semiconductor substrate having excellent operating characteristics with respect to both the IG wafer and the epitaxial wafer.

It is another specific object of the present invention to provide an improved semiconductor substrate for use with a large scale integrated circuit.

It is a further specific object of the present invention to provide a semiconductor substrate having a structure which can effectively absorb electrons inadvertently generated in the substrate.

The aforementioned objects are achieved in accordance with the present invention by heating a low resistivity semiconductor substrate at a temperature not lower than 1100° C. in order to form a high resistivity semiconductor layer at a surface of the semiconductor substrate. According to one aspect of the invention, the process for producing a semiconductor substrate comprises the steps of heating a semiconductor substrate material with a first resistivity to a temperature not lower than 1100° C. in order to produce a layer with a resistivity higher than the resistivity at the major surface of the substrate. Inert impurities are then electrically implanted into the major surface of the substrate material in order to produce a defect center in the semiconductor layer. The semiconductor material is then heated to a temperature ranging between 600° to 900° C. in order to generate micro defects in the substrate. And finally, a thin layer of single crystal semiconductor material with a resistivity higher than the resistivity of the substrate is provided. The process of the invention thus provides a semiconductor substrate comprising a high resistivity semiconductor layer with a desired thickness on the major surface of the substrate, a high density micro defect region from the surface of the high resistivity semiconductor layer to a minor surface of the substrate and a single crystal semiconductor thin layer without any defect region on the high resistivity semiconductor layer.

A substrate manufactured in accordance with the present invention is not affected by soft errors, e.g., the generation of undesirable electrons because of alpha radiation, because electrons are easily trapped by the high density defects even if the electrons are generated by X-rays in the crystal semiconductor thin layer. Moreover, the pause time of the semiconductor circuit device employing the semiconductor substrate of the invention is effectively decreased. Both p-type and n-type semiconductor material may be used to form the substrate and the dopant density of the substrate is ideally greater than $1 \times 10^{16}/cm^3$. The purpose of the heat treatment at a temperature not lower than 1100° C. is not only to produce a high resistivity semiconductor layer on the major surface of the substrate by out diffusion of dopant, such as boron and phosphorous, out of the major surface of the substrate, but also to diffuse residual impurities, such as oxygen and carbon, out of the minor surface of the substrate. The reason for limiting the heat treatment is that the step of diffusion of the dopant and the remaining impurities will not work well if the temperature of the heat treatment is not higher than 1100° C.

Ion implantation of the impurities explained above is carried out in order to generate the defect center in the high resistivity semiconductor layer in which the impurities, such as oxygen and carbon, are diffused out. At least one electrically inert element, such as carbon, oxygen, nitrogen, silicon, germanium, argon, xenon, krypton or neon may be used as an impurity. The concentration of dopants such as boron and phosphorous, in the crystal semiconductor thin layer is ideally not higher than $5\times10^{15}/cm^3$. This layer may be prepared by an expitaxial growth process, for example.

DETAILED DESCRIPTION OF THE PREFERRED EMBODIMENT

Figure 1:
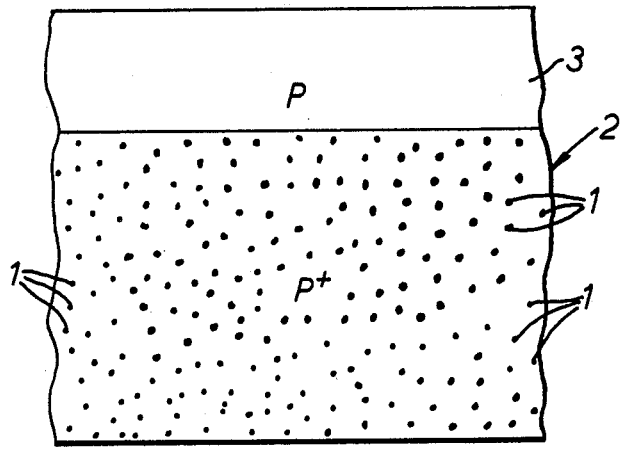
FIG. 1 is a cross-sectional view of a conventional semiconductor substrate.
Figure 2:
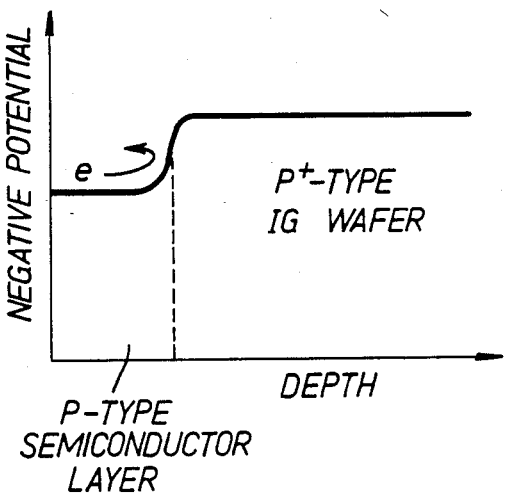
FIG. 2 is a graph showing the potential configuration of the semiconductor shown in FIG. 1.

Referring now to the drawings, the present invention will be explained in detail.

Figure 3A:
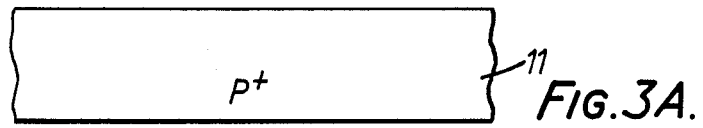
FIGS. 3A, 3B, 3C, 3D, and 3E show cross-sectional views of a semiconductor substrate in accordance with the present invention.

First, as shown in FIG. 3A a boron doped p+-type semiconductor substrate 11 of silicon is prepared by slicing a single crystal ingot of silicon grown by the Czochralski method. The resistivity of the substrate is 0.1 ohms cm. The initial oxygen and carbon concentration of the substrate are measured by infrared absorption spectroscopy, and are $1\times10^{18}/cm^3$ and $2\times10^{16}/cm^3$, respectively.

Figure 3B:
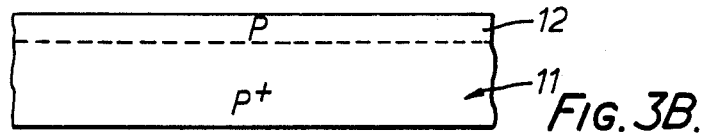
Figure 4:
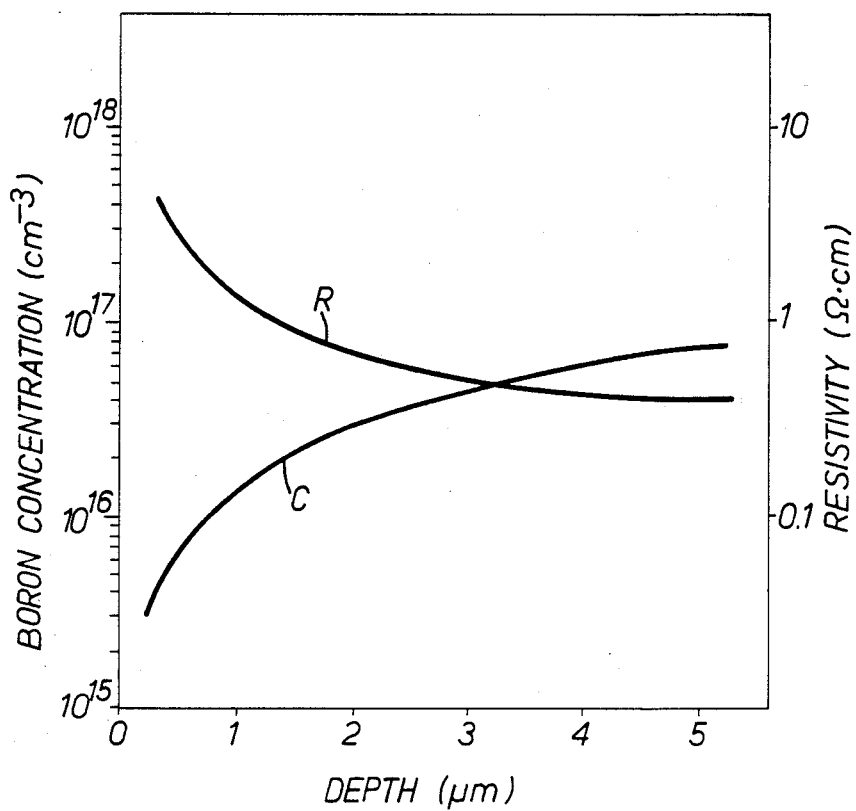
FIG. 4 is a graph showing the resistivity characteristics and boron concentration characteristics in relation to the depth from the surface of the p+-type semiconductor substrate after the substrate is treated at high temperature.

Substrate 11 is heat treated for 16 hours at a temperature of 1250° C. in a dry oxygen atmosphere. During heat treatment, boron existing in the major surface of substrate 11 is diffused. The resistivity and boron concentration of the layer existing under the major surface are measured. The resistivity is measured by a spreading resistance measurement method. As a result of the measurement, the characteristic curve shown in FIG. 4 is obtained wherein R represents the resistance curve and C represents the boron concentration curve. As seen from FIG. 4, a high resistivity semiconductor layer 12 with a resistivity of more than 1 ohm cm is prepared by heat treating a region existing within 1.5 microns of depth from the major surface of the substrate as shown in FIG. 3B. During heat treatment, other impurities in substrate 11 are simultaneously diffused. Carbon in substrate 11 is diffused during heat treatment in the oxygen atmosphere. However, the oxygen is hardly diffused by the heat treatment as the solid solubility of oxygen is $9\times10^{17}/cm^3$ at a temperature of 1250° C. After the homoginization treatment by the high temperature heat treatment explained above, micro defects are not generated in the high resistivity semiconductor layer 12 even if the substrate is treated by a low temperature heat treatment.

Figure 3C:
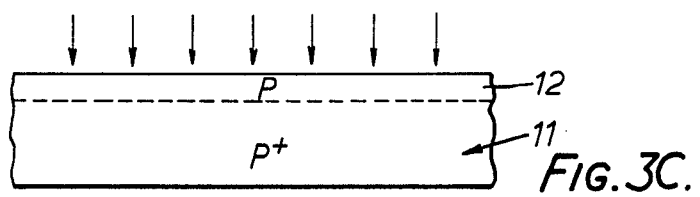
Figure 3D:
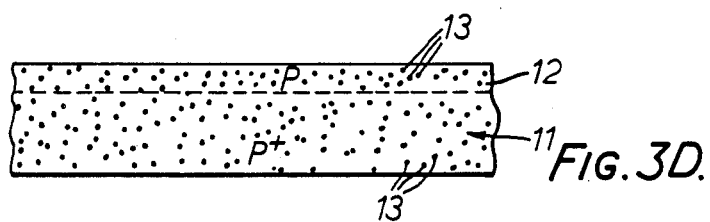
Figure 3E:
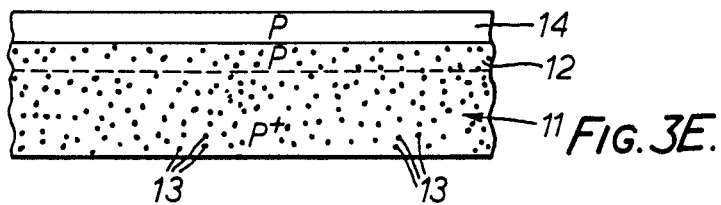
Figure 5:
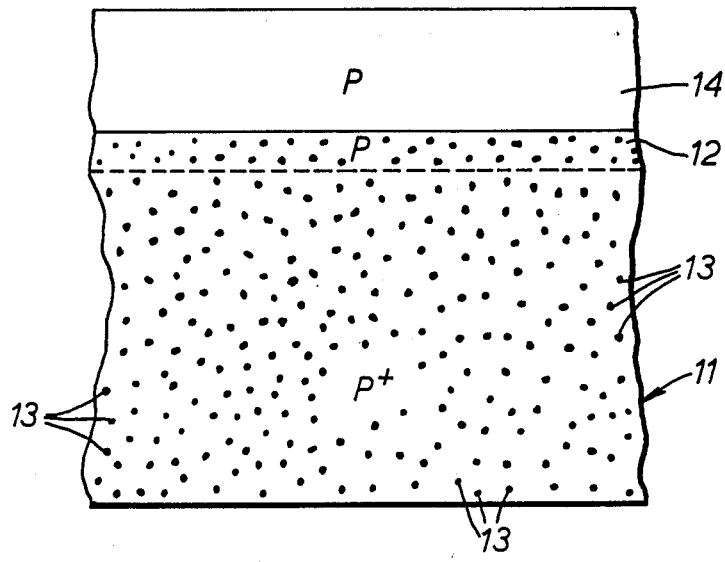
FIG. 5 is an enlargement of the substrate shown in FIG. 3E.

As shown in FIG. 3C, a defect center is generated in high resistivity semiconductor layer 12 by injecting carbon into the p+-type substrate 11 using ion implantation with an acceleration voltage of 50 KeV and an implantation dose of $3\times10^{15}/cm^2$. Substrate 11 is then heat treated at 700° C. for 16 hours. During the heat treatment, as shown in FIG. 3D, high density micro defects 13 occur in a region from the surface of the high resistivity semiconductor layer 12 to the interior substrate 11. By the process explained above, the high resistivity semiconductor layer, which has a resistivity ten times greater than the resistivity of the substrate, is formed in the region extending from the major surface to a depth of 1.5 microns as shown in FIG. 4 and also has a high density defect region formed in the entire area of the substrate. P-type defect-free crystal silicon thin layer 14 is grown on the major surface of substrate 11 by an epitaxial growth process. The thin layer with a thickness of 6 microns has a resistivity of 5 ohms cm which is higher than the resistivity of the substrate but is lower than the resistivity of the high resistivity semiconductor layer 12. The cross-sectional view of the resultant structure of the substrate is shown in FIG. 3E and FIG. 5. FIG. 5 is an enlargement of FIG. 3E.

Figure 6:
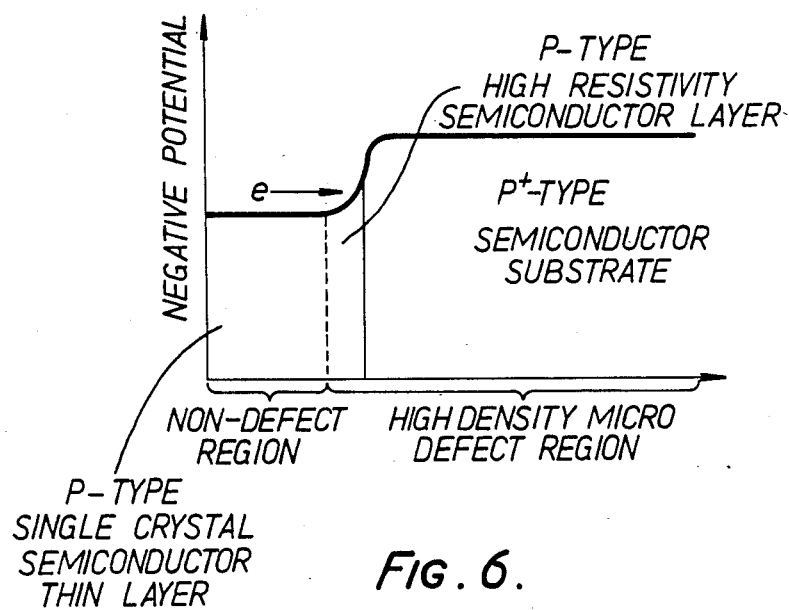
FIG. 6 is a graph showing the electrical potential configuration of the semiconductor substrate prepared by the process of the invention.

Consequently, as shown in FIG. 5, the process for producing a semiconductor substrate in accordance with the invention provides a semiconductor substrate which comprises a high resistivity semiconductor layer 12 with a thickness of 1.5 microns under the major surface of the substrate, a highly dense micro defects occurring in the entire area of the substrate, and a p-type defect-free crystal silicon thin layer 14 grown on the major surface of the substrate. Accordingly, when electrons are accidentaly generated in the p-type single crystal silicon by incidence of x-rays, as shown in FIG. 6, a large electrical potential difference does not exist at the boundary between the thin layer 14 and the high density defect region. This is due to the fact that high resistivity semiconductor layer 12 containing high density micro defects is disposed between the thin layer 14 and the region so that these electrons occured in the thin layer 14 are easily trapped by the micro defects. Thus, the semiconductor substrate prevents soft errors. Thus, the substrate has the same effect as that of an IG wafer. The pause time is also decreased because of the smaller diffusion length of electrons accidentally occuring in the substrate 11.

A 64K dynamic RAM was constructed in the p-type single crystal silicon thin layer of a semiconductor substrate produced by the process according to the invention. The RAM was found to have 2 to 3 times better operating characteristics, with respect to soft errors, pause time and p-n junction leakage current, than a RAM employing a conventional p-type wafer and a p-type epitaxial wafer. Moreover, the fluctuation characteristics of the substrate potential of the substrate according to the invention was shown to be twice as good as the conventional p-type wafer and p-type IG wafer.

The invention may also be applied to a process for producing an n-type semiconductor substrate. The process for producing a semiconductor substrate can provide a substrate suitable for use in the manufacture of large scale integrated circuits, such as 64K and 256K dynamic RAM and 64K static RAM.

It may be noted that many modifications and variations of the above described embodiments will become apparent to those of ordinary skill in the art from a reading of this disclosure. The invention is not limited to the particular device disclosed. Its scope is governed only by the scope of the appended claims.

I claim:

1. A process for producing a semiconductor substrate comprising the steps of:
    heating a semiconductor substrate material with a first resistivity at a temperature not less than 1100° C. in order to change a major surface of said substrate material into a high resistivity semiconductor layer with a second resistivity higher than said first resistivity, said high resistivity semiconductor layer having resistivity more than 1 ohm cm at a depth of 1.5 um from said major surface of said substrate material, implanting electrically inert impurities into said major surface of said substrate material to produce defect centers in said high resistivity semiconductor layer.

heating said substrate material at a temperature ranging from 600° to 900° C. to generate micro defects in both of said substrate material and said high resistivity semiconductor layer, and providing a single crystal semiconductor layer with a third resistivity between said first and second resistivity on said major surface of said substrate material, said third resistivity being larger than said first resistivity.

2. A process for producing a semiconductor substrate according to claim 1 wherein said substrate material contains a dopant element in an amount of not lower than $1 \times 10^{16}/cm^3$ and said single crystal semiconductor layer contains a dopant element in an amount of not higher than $5 \times 10^{15}/cm^3$.

3. A process for producing the semiconductor substrate according to claim 1 wherein said impurities implanted into said major surface are at least one member selected from the group consisting of carbon (C), nitrogen (N), oxygen (O), silicon (Si), germanium (Ge), tin (Sn), argon (Ar), xenon (Xe), krypton (Kr) and neon (Ne).

* * * * *